United States Patent [19]

Quaderer

[11] 4,421,628
[45] Dec. 20, 1983

[54] RECTANGULAR TARGET PLATE FOR CATHODE SPUTTERING APPARATUS

[75] Inventor: Hans Quaderer, Schaan, Liechtenstein

[73] Assignee: Balzers Aktiengesellschaft, Liechtenstein

[21] Appl. No.: 475,479

[22] Filed: Mar. 15, 1983

[30] Foreign Application Priority Data

Mar. 22, 1982 [CH] Switzerland .......................... 1735/82

[51] Int. Cl.³ .............................................. C23C 15/00
[52] U.S. Cl. .................................. 204/298; 204/192 R
[58] Field of Search ............................ 204/298, 192 R

[56] References Cited

U.S. PATENT DOCUMENTS 4,200,510  4/1980  O'Connell .......................... 204/298

*Primary Examiner*—Arthur P. Demers
*Attorney, Agent, or Firm*—McGlew and Tuttle

[57] ABSTRACT

A rectangular target plate for cathode sputtering apparatus has a groove which extends on the side of the surface to be sputtered, along a center line, and in the bottom of which recesses 5 are provided. By means of a thrust strip 6 inserted into the groove, the target plate can be secured to a cooled support, to obtain a satisfactory thermal contact. The depth of the groove is to ensure that the thrust strip does not protrude from the sputtering plane.

2 Claims, 1 Drawing Figure

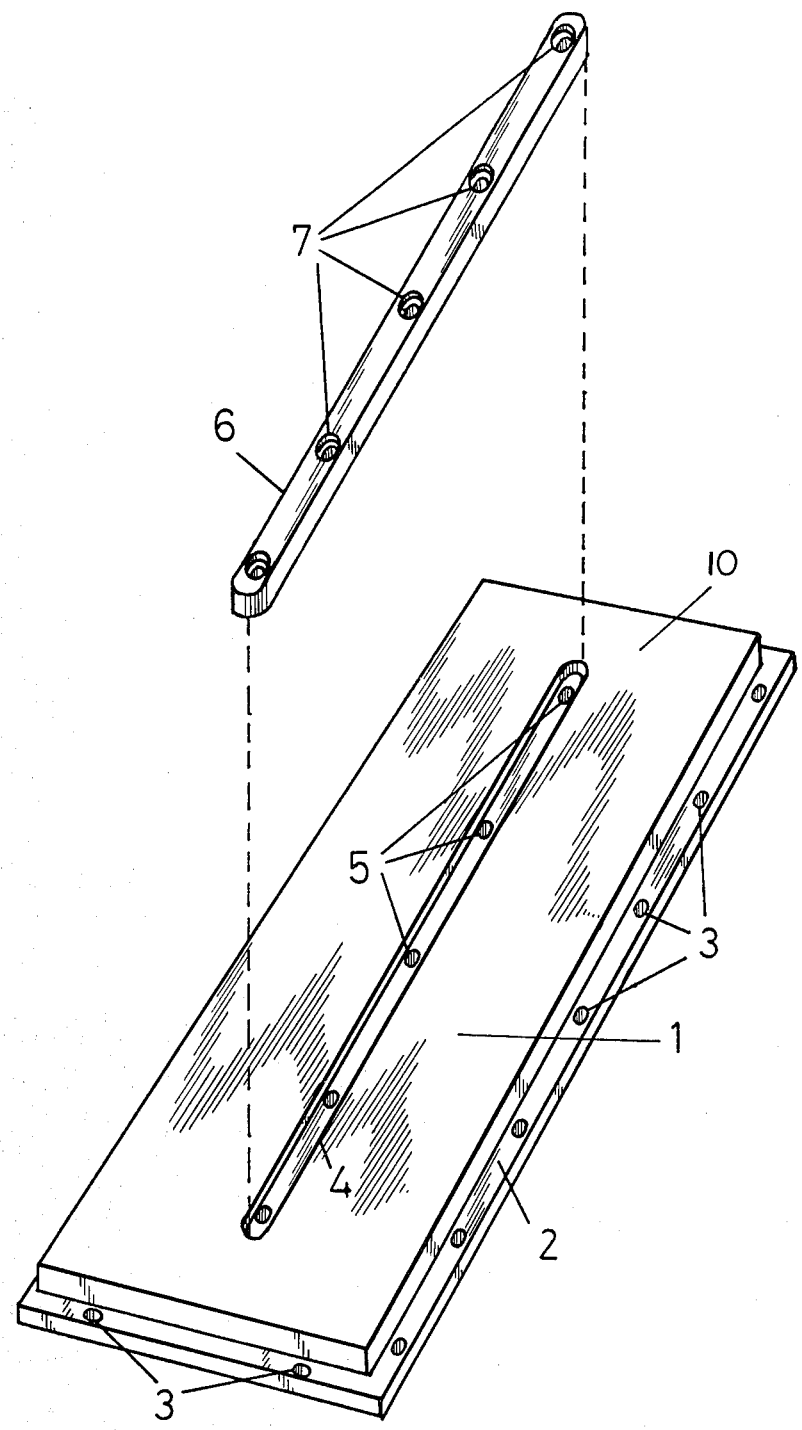

RECTANGULAR TARGET PLATE FOR CATHODE SPUTTERING APPARATUS

FIELD AND BACKGROUND OF THE INVENTION

This invention relates in general to devices used for cathode sputtering and in particular to a new and useful target for cathode sputtering apparatus.

The invention relates to a target plate for cathode sputtering. Such target plates are made from the material to be sputtered in a respective apparatus in which a layer of this material or, with the presence of a chemically active residual gas in the sputtering apparatus, a chemical compound of the target material with the active gas is to be deposited on substrate surfaces.

With apparatus of large capacity, the cathode plates, being bombarded with ions, are frequently exposed to a very high thermal load and must be cooled, to dissipate the thermal energy in excess. Nevertheless, with high performances, the problem arises that the cathode plates, when pressed against a cooled support while being rigidly clamped at their edges, as usual, warp due to thermal expansion and disengage from this support, so that the cooling ceases to be satisfactory and the target material is heated to a too high temperature. The material then becomes plastically deformable and may finally even melt.

To prevent a failure of this kind, it has already been attempted to braze or weld the backside of the target plate to the cooled support. Such a connection however, must be made very carefully, otherwise the target plate may still disengage from the support; in any case, this brazing or welding is expensive. Up to now, it has proved most satisfactory to firmly screw the target plate to the cooled support at the periphery and also to provide securing with screws at the center of the plate, to prevent detachment in this area.

SUMMARY OF THE INVENTION

The present invention is directed to a target plate for cathode sputtering, ensuring a more satisfactory operation by eliminating deficiencies in cooling.

The invention provides a target for cathode sputtering apparatus which comprises a rectangular plate which has a surface to be sputtered with a longitudinally elongated groove therein which has a plurality of recesses extending along the bottom of the groove intended for securing purposes and provided along a center line extending parallel to the longer sides of the target plate surface. The recesses are provided on the bottom of the groove and extend along the center line of the plate.

Accordingly, it is an object of the invention to provide an improved target plate for cathode sputter apparatus.

A further object of the invention is to provide a target plate which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWING

In the drawings:

FIG. 1 is an exploded perspective view of a rectangular target plate for cathode sputtering constructed in accordance with the invention.

DESCRIPTION OF THE PREFERRED EMBODIMENT

Referring to the drawing in particular the invention embodied therein comprises a target for cathode sputtering apparatus which comprises a plate generally designated 1 which is of rectangular form and has a surface 10 to be sputtered which has a longitudinally elongated groove 4 therein. A plurality of recesses 5 intended for securing purposes are provided along the center line extending parallel to the longer sides of the surface 10 and are located at the bottom of the groove 4 and extend along the center line of the plate.

The figure shows a rectangular target plate 1, of pure aluminum, for example. Along its periphery, the plate is recessed to form a shoulder 2 in which a plurality of recesses 3 is provided for screws, to secure the plate to a cooled support in a cathode sputtering apparatus. In accordance with the invention, and as shown in the figure, a groove 4 is provided in the plate 1. The plate 1 also has a row of recesses 5 provided in at the bottom of the groove 4 so that the plate can be firmly secured to the cooled support also along a center line. For this purpose is provided a thrust strip 6 having holes 7 which correspond to the recesses in the groove and through which the screws extend. It is advisable to provide a groove 4 of such a depth that neither the strip nor the screws protrude from the target plate during the cathode sputtering operation. This safely prevents the material of the securing elements from being sputtered along with target material, and thus from contaminating the layers to be deposited.

Experience has shown that the provided groove 4 produces a surprising effect in addition. Due to the strongly reduced thickness of plate 1 in the area of the groove bottom, a particularly satisfactory cooling is now obtained just in the central portion of the plate where frequently the highest temperature occurs during operation with prior art apparatus. A flow of material in this area is thereby avoided. Securing of the plate 1 with a thrust strip is mechanically particularly effective, and a reliable thermal contact with the support is thereby obtained. Difficulties hitherto encountered with target plates which also were screwed centrally, but without the use of a thrust strip, are completely eliminated by the inventive design.

While a specific embodiment of the invention has been shown and described in detail to illustrate the application of the principles of the invention, it will be understood that the invention may be embodied otherwise without departing from such principles.

What is claimed is:

1. A target for cathode sputtering apparatus, comprising a rectangular plate having a surface to be sputtered with a longitudinally elongated groove therein, a plurality of recesses located in the groove at spaced locations and intended for securing purposes being located along a center line extending parallel to the longer side of said surface, the recesses being provided in the bottom of said groove and extending along the center line of said plate.

2. A target according to claim 1, including a thrust strip of a size to fit in said groove without protruding outwardly thereof adapted to be used for securing the target plate to a support.

* * * * *